United States Patent [19]
Boezen

[11] Patent Number: 5,185,651
[45] Date of Patent: Feb. 9, 1993

[54] INTEGRATED CIRCUIT WITH CURRENT DETECTION

[75] Inventor: Hendrik Boezen, Nijmegen, Netherlands

[73] Assignee: U.S. Philips Corporation, New York, N.Y.

[21] Appl. No.: 552,738

[22] Filed: Jul. 12, 1990

[30] Foreign Application Priority Data

Jul. 14, 1989 [NL] Netherlands ............... 8901822

[51] Int. Cl.⁵ .................. H01C 1/14; H01L 19/00
[52] U.S. Cl. .................. 257/734; 257/773; 257/798; 257/923
[58] Field of Search ............... 357/51, 68, 65

[56] References Cited

U.S. PATENT DOCUMENTS

| | | | |
|---|---|---|---|
| 3,808,475 | 4/1974 | Buelow et al. | 357/45 |
| 4,215,333 | 7/1980 | Huang | 357/51 |
| 4,845,462 | 7/1989 | Van de Grift et al. | 357/51 |

FOREIGN PATENT DOCUMENTS

| | | |
|---|---|---|
| 0130591 | 1/1985 | European Pat. Off. . |
| 57-17146 | 1/1982 | Japan . |
| 59-29447 | 2/1984 | Japan . |
| 60-59774 | 4/1985 | Japan .................. 357/68 |
| 60-218856 | 11/1985 | Japan . |
| 61-15350 | 1/1986 | Japan . |

Primary Examiner—Joseph A. Popek
Assistant Examiner—Viet Q. Nguyen
Attorney, Agent, or Firm—Bernard Franzblau

[57] ABSTRACT

An apparatus for monitoring the current in an integrated circuit provided with a current conductor which is to supply current to a semiconductor structure at least temporarily and to supply current to other parts of the circuit. The current conductor is locally split into a first and a second parallel partial current conductor, with the semiconductor structure connected to the first partial current conductor. The first and second partial current conductors are connected to respective first and second connection contacts across which a voltage drop can be derived which is a measure of the value of the current flowing through the semiconductor structure.

19 Claims, 3 Drawing Sheets

INTEGRATED CIRCUIT WITH CURRENT DETECTION

BACKGROUND OF THE INVENTION

This invention relates to an integrated circuit provided with:
a semiconductor structure comprising a current path designed to pass a current during operation,
a current conductor of sufficient width and thickness both for supplying the said current to the semiconductor structure during operation and for supplying current to other parts of the circuit,
a resistance element between the semiconductor structure and the current conductor designed to generate a voltage drop which is proportional to the current through the semiconductor structure during operation, and
two connection contacts across which the said voltage drop can be derived.

Integrated circuits are known in which the current through a semiconductor structure, which forms a part of the circuit, is monitored by means of the voltage drop generated by this current across a resistor present for this purpose in a current path of the semiconductor structure. Such a current monitoring problem occurs, for example, in voltage stabilizers, power end stages, and the like. Generally, the said resistance is created by dimensioning a portion of the metallization pattern in such a way that this portion can function as a (small) resistance.

An example of such a specially designed metallization pattern is described in Patent Abstracts of Japan 56-71963 (Japanese application 54-148902). According to this publication, the small resistance consists of a portion of a metal track between two vertical connecting tracks which lead through an insulating layer to further metal tracks at a lower level.

Another possibility for manufacturing a resistor of the type referred to above is described in, for example, Patent Abstracts of Japan 56-116658 (Japanese Patent application 55-18982). This known resistor consists of a layer of resistor material of predetermined length, width and thickness with a connection region at either end. The disadvantage of such a resistor is that it occupies a comparatively large surface area.

SUMMARY OF THE INVENTION

An object of the invention is to provide a way in which a resistor of the type referred to above can be realized in an integrated circuit so that the resistance element occupies little space and the integrated circuit is thus provided with a compact structure.

This object is achieved in an integrated circuit of the type referred to in the opening paragraph in that
the current conductor is locally divided into a first and a second parallel partial current conductor (a first and a second sub-conductor),
an end of the current path of the semiconductor structure is connected to the first partial current conductor (first sub-conductor, and
the first and second sub-conductors or partial current conductors are connected to first and second connection contacts, respectively.

Since the current through the semiconductor structure runs exclusively through the first partial current conductor, whereas the current to the further parts of the circuit is branched out over both partial current conductors, a potential difference arises across the connection contacts connected to the two partial current conductors, which potential difference is proportional to the current through the transistors. This means that no separate resistance element needs to be created in the metallization phase.

Preferably, the partial current conductors are realized by the formation of a longitudinal split or slot in the current conductor with a wherein the length of the slot is sufficient to insure that the current path of the semiconductor structure makes contact exclusively with the first partial current conductor.

BRIEF DESCRIPTION OF THE DRAWINGS

The invention will be explained in more detail below with reference to the accompanying drawings, in which.

DESCRIPTION OF THE PREFERRED EMBODIMENTS

Figure 1:
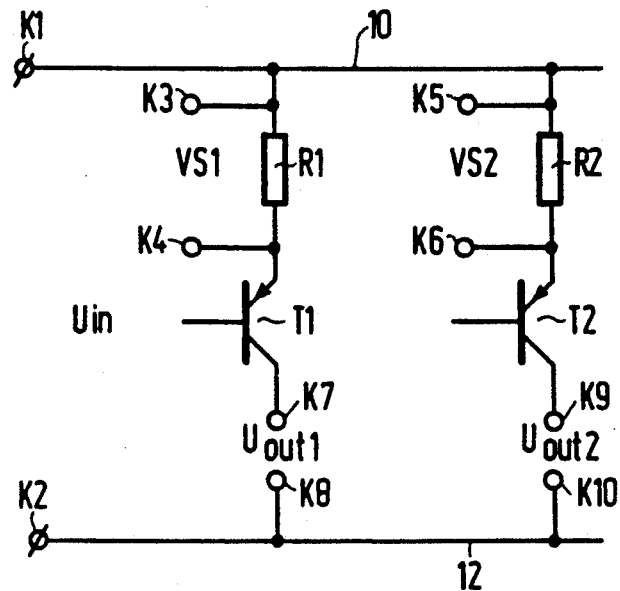
FIG. 1 shows diagrammatically the type of circuit in which the device according to the invention may be used.

FIG. 1 shows diagrammatically a type of circuit in which the device according to the invention may be used. FIG. 1 illustrates two transistor circuits consisting of resistors R1, R2, and transistors T1, T2, respectively, each connected in series with a pair of output terminals k7, k8 and k9, k10, respectively, between two current conducting lines 10 and 12. The current conducting lines 10 and 12 are provided with connection terminals k1, k2, respectively, at which an input voltage $U_{in}$ can be supplied, while an output voltage $U_{out1}$, $U_{out2}$, can be derived from the respective output terminals k7, k8 and k9, k10. Such transistor circuits, which are generally known, are used in, for example, stabilized supplies, amplifier end stages and the like. In many cases it is desirable to have available in the further circuits, of which these stages form a part, information about the current supplied by the transistors T1, T2, to the relevant output terminals k7, k9, respectively. This current may be determined from the voltage drop arising across the resistors R1 and R2, respectively. In FIG. 1 these voltage drops are designated Vs1 and Vs2 and can be measured across the connection terminals k3, k4, and k5, k6, respectively.

Figure 2:
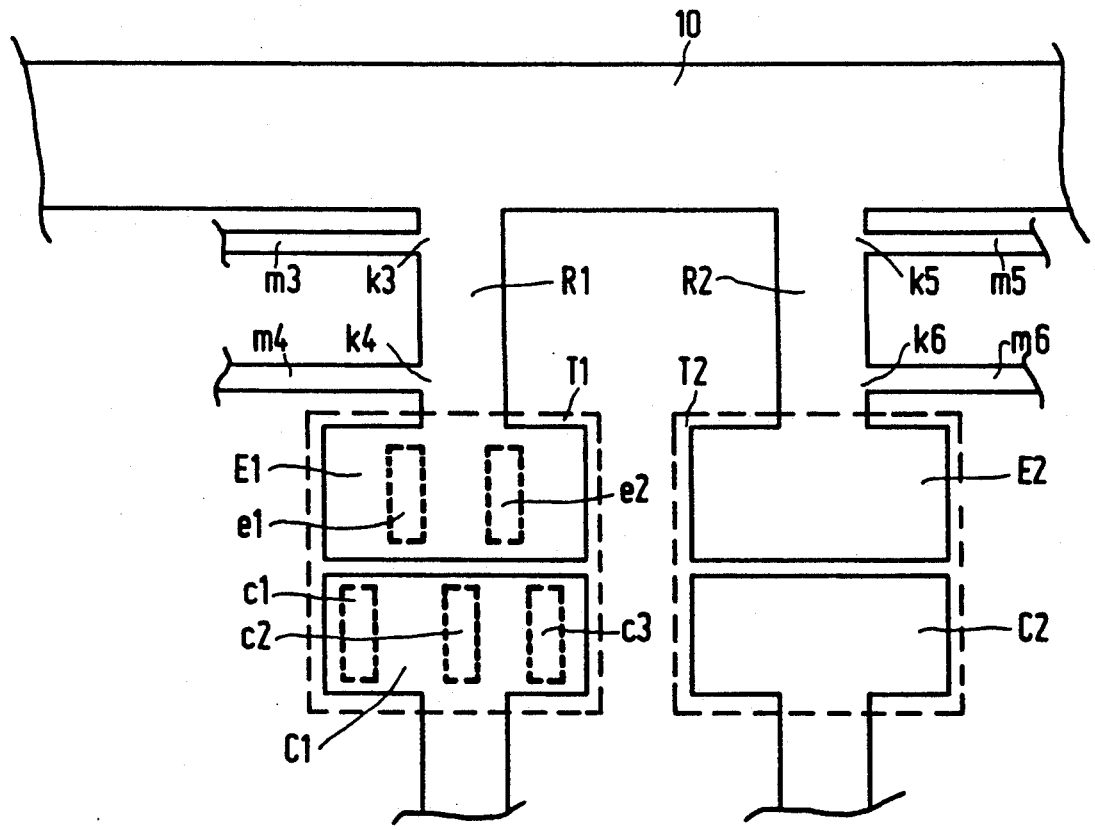
FIG. 2 shows a metallization pattern according to the present art.

FIG. 2 shows a practical embodiment of a metallization pattern for realizing the resistances R1 and R2, and further shows diagrammatically the transistors T1 and T2, connected to the current conducting line 10 via the resistors R1 and R2, respectively. The device shown in FIG. 2 is assumed to be known to those skilled in the art. FIG. 2 shows a track pattern manufactured from a conducting material, for example, aluminium, consisting of a relatively wide track 10, which serves as the main current conductor and from which two current conductors R1 and R2 of smaller dimensions branch off to connection regions E1 and E2, respectively. These connection regions provide the contact with the emitters of the respective transistors T1 and T2. The structure of these transistors T1 and T2 is not shown in the Figure and is assumed to be known to those skilled in the art. The collector regions of the two transistors are in contact with the respective connection regions C1 and C2, from which conductor tracks run to the contacts k7, k9 (not shown) and possibly to further parts of the circuits. As is diagrammatically shown in FIG. 2, the connection between the connection region E1 and the emitter of the transistor T1 may be formed by a number of divided vertical connecting conductors designated as e1, e2. In a similar manner, the connection region C1 is connected to the collector region proper of the transistor T1 via a number of divided vertical connecting conductors c1, c2, c3. This connecting method is assumed to be known per se to those skilled in the art. The vertical connecting conductors are not shown for the transistor T2, nor are they shown in detail in the subsequent Figures.

It will be clear that there is no essential difference between the use of pnp and npn transistors. This means that in the above description the terms "emitter" and "collector" can be simply interchanged without detracting from the invention yet to be described. In addition, a different semiconductor structure may be used instead of the transistors T1, T2, such as a diode, a thyristor, and the like.

In the pattern of FIG. 2, the conductor tracks R1 and R2, provided they are correctly dimensioned, serve as resistance elements having a small but sufficient resistance for causing a voltage drop across them which can be detected by means of a measuring circuit which can be connected to the terminals k3, k4 and k5, k6 via the measuring lines m3, m4 and m5, m6, respectively. As was stated above, this circuit has the disadvantage that it requires a relatively large surface area for realizing the resistance tracks R1 and R2.

Figure 3:
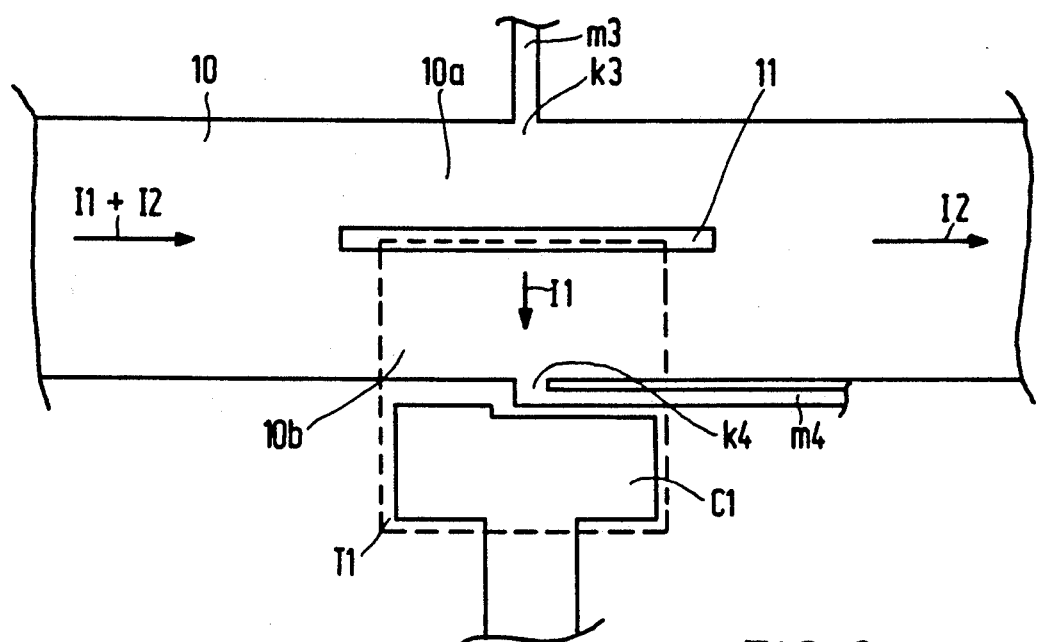
FIG. 3 shows an embodiment of a device according to the invention.

An integrated circuit according to the invention is shown in FIG. 3. In FIG. 3, the main current conductor, through which current is supplied to a circuit element such as the transistor T1, is designated with the reference numeral 10 again. This main current conductor is divided into two partial current conductors or sub-conductors 10a and 10b by means of a slot 11 at the area of the transistor T1. The partial current conductor 10a has no contact of any sort with any part of the transistor T1, whereas the partial current conductor 10b makes contact with the emitter (or collector) of transistor T1. The connection region C1 is in contact with the collector (or emitter) of the transistor T1 and is constructed in the same way as illustrated in FIG. 2. The partial current conductor 10a is provided with a contact k3 and the partial current conductor 10b with a contact k4. Measuring lines m3 and m4 extend from the two contacts to further parts of the circuit, where the potential difference across k3 and k4 is further evaluated.

It is assumed that the current flows from left to right in FIG. 3. A portion of the incoming current I1+I2 flows through the one partial current conductor 10b to the transistor T1. This portion is designated as I1 in FIG. 3. The other portion proceeds to further parts of the circuit and is designated as I2. A result of the current I1 is that a potential difference will arise between the measuring terminals k3 and k4. The through-going current I2, which branches out over the two partial current conductors 10a and 10b first and is then united again, does not contribute to this potential difference. In other words, the potential difference between the terminals k3 and k4 is a measure of the current I1 which flows through the transistor T1. This potential difference may be measured in the same way as in the present art, for example, by means of a suitable measuring circuit in the device of which the circuit according to the invention forms part. A comparison of the FIGS. 2 and 3 shows, however, that the configuration according to the invention leads to a considerable saving in space.

Figure 4A:
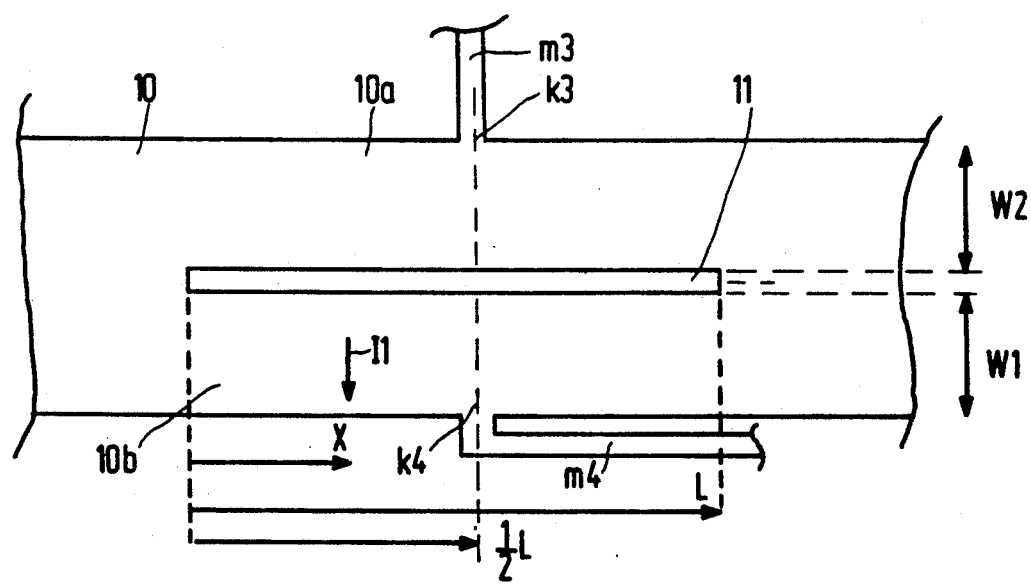
FIG. 4 shows a detailed view of the split current conductor for the derivation of an equivalent resistance.

A derivation will now be given of the equivalent resistance network with reference to the FIGS. 4a and 4b. In FIG. 4a, the split portion of the current conductor 10 is shown again. The length of the slot 11 is denoted as L, the measuring contacts k3 and k4 are placed in the center of the split length, thus at a distance 0.5 L from the beginning of the split. At the same time, it is assumed that the current I1 flowing through the transistor T1 is taken off at an average distance x from the beginning of the split 11. It is further assumed that the partial current conductor 10a has a width W2 and that the partial current conductor 10b has a width W1.

Figure 4B:
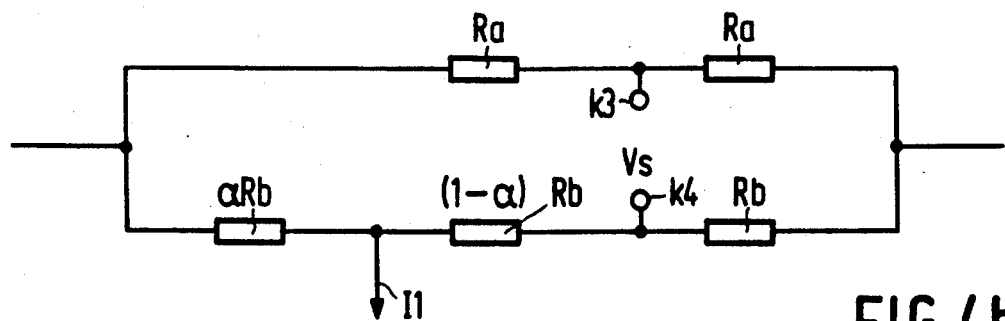

In FIG. 4b, the accompanying equivalent resistance network is illustrated. The partial current conductor 10a is divided into two equal resistances Ra by the connection contact k3, while in a similar manner the partial current conductor 10b is divided into two equal resistances Rb by the contact k4. Since the current I1 is branched off at a distance x, one of these resistances Rb is divided into two partial resistances, i.e. a resistance $\alpha$Rb and resistance $(1-\alpha)$Rb, a variation in the distance x obviously resulting in a similar variation of the factor $\alpha$. The following relation can be derived for this equivalent resistance network:

$$\frac{V}{I} = \frac{Ra + Rb}{(2-\alpha)Rb + 2Ra} \cdot \frac{\alpha Rb(2Ra + (2-\alpha)Rb)}{\alpha Rb + 2Ra + (2-\alpha)Rb}$$

$$= \frac{\alpha}{2} Rb = \frac{1}{2} \cdot \frac{2x}{L} \cdot \frac{L/2}{W_1} \cdot Rm = \frac{x}{2W_1} \cdot Rm$$

$$Req = \begin{cases} \frac{x}{2W_1} Rm & 0 < x < L/2 \\ \frac{L-x}{2W_1} Rm & L/2 < x < L \end{cases}$$

in which $R_m$ = surface resistance.

It is assumed in the above that the contacts k3 and k4 are positioned at the center of the split length. Although this is not necessary, this positioning is definitely preferable because a maximum potential difference across the contacts k3 and k4 is generated in this way.

It should furthermore be noted that the above equations can also be applied in the case in which the current I1 is taken off in portions, for example, in a configuration in which a number of connection conductors is present between the current conductor 10b and the subjacent collector region (or emitter region) of the transistor T1, such as has been drawn for a known configuration in FIG. 2 (transistor T1). In each particular case, the equations may be adapted for each of the relevant connection conductors (with an adapted value for x each time, after which the results can be combined in a simple manner).

As the above equations show, the widths W1 and W2 of the two partial current conductors may be chosen at random to a certain degree (taking into account further requirements imposed on the circuit). In principle, therefore, it is possible to choose the width of one of the two partial current conductors relatively small and the width of the other partial current conductor relatively great. An embodiment in which such a choice was made is illustrated in FIG. 5.

Figure 5:
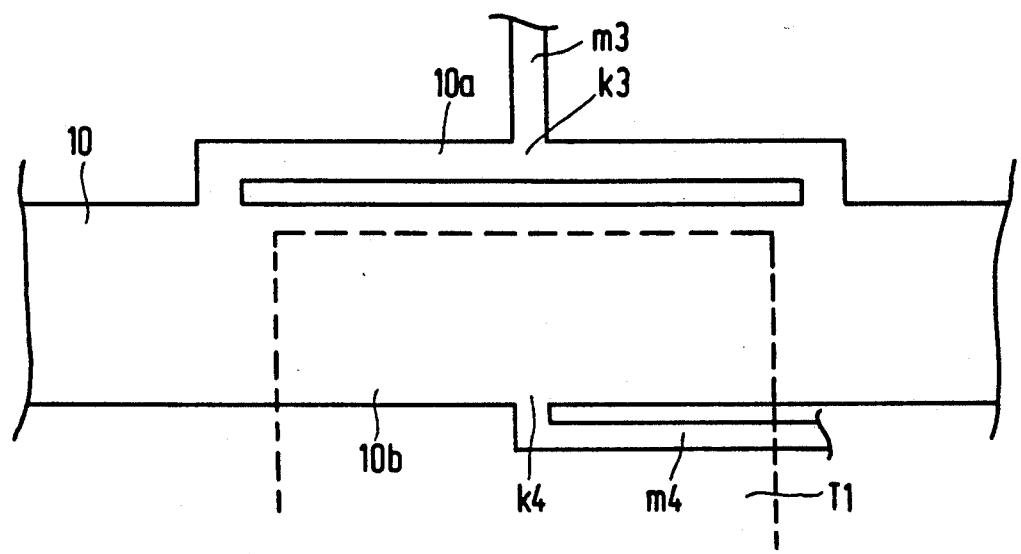
FIG. 5 shows an alternative embodiment of the split current conductor.

In FIG. 5, the partial current conductor 10a is designed as a separate conductor element which is positioned in parallel with the partial current conductor 10b, which in its turn forms a direct continuation of the main current conductor 10. The ends of the partial current conductor 10a are connected to the current conductor 10 at areas lying upstream and downstream of the area where the current conductor is connected to the circuit element (T1), i.e., at the respective beginning and end of the partial current conductor 10b, and at a sufficient distance outside the boundary of the transistor T1. The partial current conductor 10a is provided with a contact k3, to which is connected the measuring line m3, and the partial current conductor 10b is provided with the contact k4, to which is connected the measuring line m4. The working principle of this configuration is fully identical to the working principle of the device shown in FIG. 3.

Figure 6:
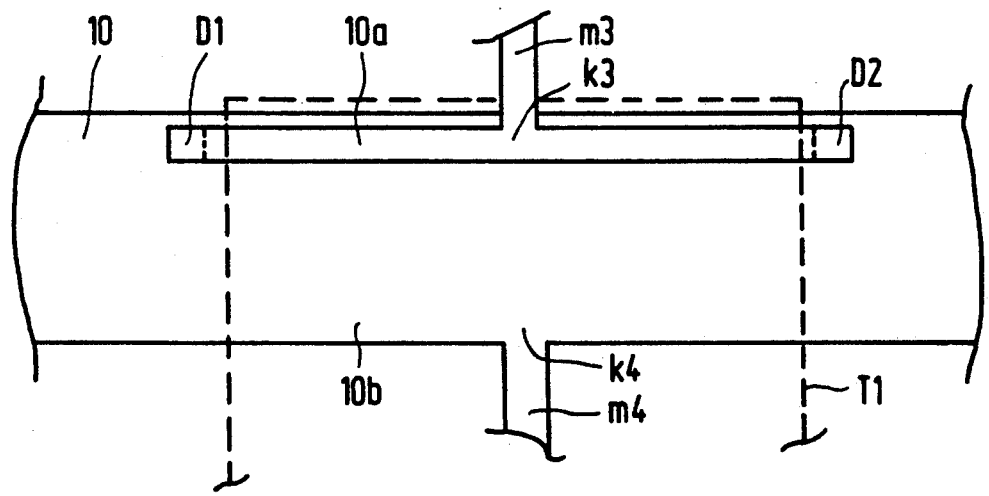
FIG. 6 shows a further embodiment of the split current conductor.

Another possible embodiment of a device according to the invention is illustrated in FIG. 6 wherein one sub-conductor is at least locally positioned over the other sub-conductor. In FIG. 6, the partial current conductor 10b is again a direct continuation of the main current conductor 10. There is not any objection to choosing the dimension of the current conductor 10 to be equal to that of the partial current conductor 10b. An insulating layer is applied on the current conductor 10, at least locally, which layer is not separately illustrated in FIG. 6. The second partial current conductor 10a is subsequently applied on this layer and consists of a metal strip of the desired dimensions, which metal strip is in contact with the current conductor 10 at the areas designated with as D1 and D2. The partial current conductor 10a is provided with the contact k3 from which the measuring line m3 extends, and the partial current conductor 10b is provided with the contact k4 from which the measuring line m4 extends. Compared with the configuration of FIG. 5, the configuration of FIG. 6 has the advantage that even less surface area is required for realizing the device. On the other hand, it entails the disadvantage that a separate separation layer must be applied between the partial-current conductors 10a and 10b because of the vertical structure. In many cases, however, such a separation layer must be applied anyway in the total integration process, in which case the configuration according to FIG. 6 may be advantageously used.

I claim:

1. An integrated circuit comprising:
a current conductor of sufficient width and thickness for supplying current, during operation, to a semiconductor structure via a current path of the semiconductor structure and for supplying current to other parts of the circuit, wherein the current conductor is locally divided into a first and a second parallel partial current conductor in an area where said current path is connected to said current conductor,
a semiconductor structure including said current path and designed to pass a current during operation and with the current path connected to a portion of the first partial current conductor, and first and second connection contacts connected to said first and second partial current conductors, respectively, and between which first and second connection contacts a voltage drop is developed which is proportional to the current through the semiconductor structure during operation.

2. An integrated circuit comprising: a circuit element connected to a current conductor, means for measuring a voltage drop proportional to the magnitude of a current flowing through said circuit element during operation and which includes first and second connection contacts across which said voltage drop can be derived, wherein at an area where the circuit element is connected to the current conductor, the current conductor is divided into at least first and second sub-conductors with the first sub-conductor connected to the circuit element, and wherein said first and second sub-conductors are connected to said first and second connection contacts, respectively.

3. An integrated circuit as claimed in claim 2, wherein the first is situated near a border of the first sub-conductor which is remote from the second sub-conductor.

4. An integrated circuit as claimed 3, wherein the first and second sub-conductors are at least approximately the same length.

5. An integrated circuit as claimed in claim 4, wherein the sub-conductors are formed by a longitudinal split in the current conductor dividing it into said first and second sub-conductors.

6. An integrated circuit as claimed in claim 2, wherein the second sub-conductor is laterally spaced from the current conductor and has first and second ends connected to the current conductor at areas lying upstream and downstream, respectively, of the area where the current conductor is connected to the circuit element.

7. An integrated circuit as claimed in claim 6, wherein the second sub-conductor is at least substantially parallel to the current conductor.

8. An integrated circuit as claimed in claim 7, wherein the second sub-conductor is formed during the same metallization stage as the first sub-conductor.

9. An integrated circuit as claimed in claim 8, wherein the first and second sub-conductors are at least locally positioned one above the other.

10. An integrated circuit as claimed in claim 2, wherein the first and second sub-conductors are at least substantially the same length.

11. An integrated circuit as claimed in claim 10, wherein the first and second sub-conductors are formed by a longitudinal slot in the current conductor and the length of the slot is such that a current path of the circuit element is coupled exclusively to the first sub-conductor.

12. An integrated circuit as claimed in claim 10 wherein the second sub-conductor is laterally spaced from the current conductor and has first and second ends connected to the current conductor at areas lying upstream and downstream, respectively, of the area where the current conductor is connected to the circuit element.

13. An integrated circuit as claimed in claim 2 wherein, at the area where the circuit element is connected to the current conductor, the current conductor includes a longitudinal slot dividing it into said first and second sub-conductors.

14. An integrated circuit as claimed in claim 3 wherein, at the area where the circuit element is connected to the current conductor, the current conductor includes a longitudinal slot dividing it into said first and second sub-conductors.

15. An integrated circuit as claimed in claim 3 wherein the second sub-conductor is laterally spaced from the current conductor and has first and second ends which are connected to the current conductor at areas which lie upstream and downstream, respectively, of the area where the current conductor is connected to the circuit element.

16. An integrated circuit as claimed in claim 15, wherein the second sub-conductor extends in substantially the same direction as the current conductor.

17. An integrated circuit as claimed in claim 6, wherein the second sub-conductor is formed during the same metallization stage as the first sub-conductor.

18. An integrated circuit as claimed in claim 2, wherein the first and second sub-conductors are at least locally positioned one above the other and separated by a dielectric layer, and the circuit element is connected to the current conductor in the area where the sub-conductors are superimposed.

19. An integrated circuit as claimed in claim 1 wherein the second partial current conductor has ends which are connected to the first partial current conductor at areas which lie upstream and downstream of the first and second connection contacts.

* * * * *

UNITED STATES PATENT AND TRADEMARK OFFICE
CERTIFICATE OF CORRECTION

PATENT NO.  : 5,185,651
DATED       : Feb. 9, 1993
INVENTOR(S) : Hendrik Boezen

It is certified that error appears in the above-indentified patent and that said Letters Patent is hereby corrected as shown below:

```
Column 1, line 61, change "conductor" to --conductor)--;
Column 2, line  9, delete "with a";
Column 5, line 39, delete "with".
```

IN THE CLAIMS

```
Claim  3, column 6, line 21, after "first" (first occurrence)
                    insert --connection contact--.
```

Signed and Sealed this

Third Day of May, 1994

Attest:

BRUCE LEHMAN

Attesting Officer

Commissioner of Patents and Trademarks